(12) United States Patent
Cho et al.

(10) Patent No.: US 8,946,909 B2
(45) Date of Patent: Feb. 3, 2015

(54) SEMICONDUCTOR PACKAGE HAVING GAP-FILLER INJECTION-FRIENDLY STRUCTURE

(75) Inventors: Yun-rae Cho, Seoul (KR); Young-min Lee, Asan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 868 days.

(21) Appl. No.: 13/164,100

(22) Filed: Jun. 20, 2011

(65) Prior Publication Data
US 2011/0309526 A1 Dec. 22, 2011

(30) Foreign Application Priority Data
Jun. 21, 2010 (KR) .................. 10-2010-0058627

(51) Int. Cl.
*H01L 23/52* (2006.01)
*H01L 21/56* (2006.01)
(Continued)

(52) U.S. Cl.
CPC ............ *H01L 21/563* (2013.01); *H01L 23/296* (2013.01); *H01L 24/83* (2013.01); *H01L 25/0657* (2013.01); *H01L 25/50* (2013.01); *H01L 24/06* (2013.01); *H01L 24/16* (2013.01); *H01L 24/32* (2013.01); *H01L 24/48* (2013.01); *H01L 24/49* (2013.01); *H01L 24/73* (2013.01); *H01L 24/92* (2013.01); *H01L 2224/04042* (2013.01); *H01L 2224/06155* (2013.01); *H01L 2224/16227* (2013.01); *H01L 2224/32145* (2013.01); *H01L 2224/32225* (2013.01); *H01L 2224/48228* (2013.01); *H01L 2224/49175* (2013.01); *H01L 2224/73204* (2013.01); *H01L 2224/73265* (2013.01); *H01L 2224/83104* (2013.01); *H01L 2224/83385* (2013.01); *H01L 2224/92247* (2013.01); *H01L 2225/0651* (2013.01); *H01L 2225/06517* (2013.01); *H01L 2225/06558* (2013.01); *H01L 2225/06562* (2013.01); *H01L 2225/06568* (2013.01); *H01L 2924/01004* (2013.01); *H01L 2924/01013* (2013.01); *H01L 2924/01047* (2013.01); *H01L 2924/09701* (2013.01);
(Continued)

(58) Field of Classification Search
CPC .......................... H01L 23/296; H01L 21/563
USPC ................................... 257/777, 686
See application file for complete search history.

(56) References Cited

U.S. PATENT DOCUMENTS 6,380,615 B1 * 4/2002 Park et al. .......... 257/686
7,863,735 B1 * 1/2011 Cho et al. .......... 257/723
(Continued)

FOREIGN PATENT DOCUMENTS

| JP | 2007305813 A | 11/2007 |
| JP | 2009038272 A | 2/2009 |
| KR | 20090125619 A | 12/2009 |

*Primary Examiner* — Nathan Ha
(74) *Attorney, Agent, or Firm* — Harness, Dickey & Pierce, P.L.C.

(57) ABSTRACT

A semiconductor package may include a base substrate, a solder resist layer on the base substrate, a first semiconductor chip mounted on the base substrate, and a second semiconductor chip stacked on the first semiconductor chip. The second semiconductor chip may include at least one end portion protruding from the first semiconductor chip. The solder resist layer may include and a recess portion. The recess portion may be formed in the solder resist layer at a position corresponding to the at least one end portion of the second semiconductor chip.

20 Claims, 12 Drawing Sheets

(51) Int. Cl.
  *H01L 23/29* (2006.01)
  *H01L 23/00* (2006.01)
  *H01L 25/065* (2006.01)
  *H01L 25/00* (2006.01)

(52) U.S. Cl.
  CPC .......... *H01L 2924/3641* (2013.01); *H01L 2224/2919* (2013.01); *H01L 2924/01005* (2013.01); *H01L 2924/01006* (2013.01); *H01L 2924/01023* (2013.01); *H01L 2924/01033* (2013.01); *H01L 2924/01087* (2013.01); *H01L 2924/014* (2013.01); *H01L 2924/0665* (2013.01); *H01L 2224/48227* (2013.01); *H01L 2924/19107* (2013.01); *H01L 2224/27013* (2013.01); *H01L 2224/45139* (2013.01); *H01L 2224/16225* (2013.01)
  USPC .......................................... 257/777

(56) References Cited

U.S. PATENT DOCUMENTS

| | | | | |
|---|---|---|---|---|
| 7,989,950 | B2* | 8/2011 | Park et al. | 257/724 |
| 7,994,622 | B2* | 8/2011 | Mohammed et al. | 257/686 |
| 8,039,939 | B2* | 10/2011 | Hwang | 257/680 |
| 8,115,307 | B2* | 2/2012 | Toyama et al. | 257/737 |
| 8,143,097 | B2* | 3/2012 | Chi et al. | 438/107 |
| 8,263,434 | B2* | 9/2012 | Pagaila et al. | 438/109 |
| 8,564,036 | B2* | 10/2013 | Warashina et al. | 257/293 |
| 2005/0224944 | A1* | 10/2005 | Biar et al. | 257/686 |
| 2009/0200651 | A1* | 8/2009 | Kung et al. | 257/685 |

* cited by examiner

SEMICONDUCTOR PACKAGE HAVING GAP-FILLER INJECTION-FRIENDLY STRUCTURE

CROSS-REFERENCE TO RELATED APPLICATIONS

This application claims priority under 35 U.S.C. 119 to Korean Patent Application No. 10-2010-0058627, filed on Jun. 21, 2010, in the Korean Intellectual Property Office (KIPO), the disclosure of which is incorporated herein in its entirety by reference.

BACKGROUND

1. Field

Example embodiments relate to a printed circuit board (PCB) and a semiconductor package including the PCB, and more particularly, to a PCB including a recess, and a semiconductor package including the PCB.

2. Description of the Related Art

With the development of semiconductor technologies, semiconductor packages are becoming more integrated and thus semiconductor products are being made smaller and lighter. In order to shrink and lighten semiconductor products, a method of repeatedly stacking a plurality of semiconductor chips is used. In a semiconductor chip stacking structure, underfill resin is used to fix a lower semiconductor chip and an upper semiconductor chip that is stacked on the lower semiconductor chip. As the underfill resin is injected into a gap between a PCB and a semiconductor chip and cured therein, a connection space between the PCB and the semiconductor chip is reinforced by the underfill resin.

SUMMARY

Example embodiments provide a printed circuit board (PCB) in which a gap-fill margin may be improved. Example embodiments also provide a semiconductor package including the PCB.

Example embodiments provide a PCB that may prevent or reduce voids in an upper chip adhesive tape from being trapped by an underfill during an underfill process, and a semiconductor package including the PCB.

In accordance with example embodiments, a semiconductor package may include a base substrate, a solder resist layer on the base substrate, a first semiconductor chip on the base substrate, and a second semiconductor chip on the first semiconductor chip. In example embodiments, the solder resist layer may include a first recess portion. In example embodiments, the second semiconductor chip may include at least one end portion protruding from the first semiconductor chip and overhanging the first recess portion.

In accordance with example embodiments, a printed circuit board may include a base substrate on which a first semiconductor chip and a second semiconductor chip stacked on the first semiconductor chip are mounted. In example embodiments, the printed circuit board may further include a solder resist layer between the base substrate and the first semiconductor chip and the solder resist layer may include a first recess portion. In example embodiments the second semiconductor chip may include at least one end portion protruding from the first semiconductor chip, and the first recess portion may be in the solder resist layer at a position corresponding to the at least one end portion of the second semiconductor chip.

In accordance with example embodiments, a printed circuit board may include a base substrate and a solder resist layer on the base substrate. In example embodiments, the solder resist layer may include at least one recess exposing a portion of the base substrate and a portion of the base substrate adjacent the at least one recess may be configured support a first semiconductor chip. In example embodiments, a width of the at least one recess may be substantially the same as a width of the first semiconductor chip.

In accordance with example embodiments, a semiconductor package may include a base substrate, a solder resist layer formed on the base substrate and comprising a recess portion, a first semiconductor chip mounted on the base substrate, and a second semiconductor chip stacked on the first semiconductor chip and comprising at least one end portion protruding from the first semiconductor chip, wherein the recess portion is formed in the solder resist layer at a position corresponding to the at least one end portion of the second semiconductor chip.

The semiconductor package may further include an insulation member formed between the second semiconductor chip and the recess portion. The insulation member may contact a side surface of the first semiconductor chip.

The recess portion may expose a portion of the base substrate, and the insulation member may be formed between the second semiconductor chip and the exposed portion of the base substrate.

The insulation member may encapsulate the first semiconductor chip and the second semiconductor chip.

The semiconductor package may further include an adhesive tape provided between the first semiconductor chip and the solder resist layer.

The thickness of the insulation member may be the same as a sum of the thickness of the first semiconductor chip, the thickness of the adhesive tape, and the thickness of the solder resist layer.

In accordance with example embodiments a semiconductor package may include a base substrate, a solder resist layer formed on the base substrate, a first recess portion formed in the solder resist layer and exposing a portion of the base substrate, a first semiconductor chip mounted on the base substrate, a second semiconductor chip stacked on the first semiconductor chip and comprising at least one end portion protruding from the first semiconductor chip, and an insulation member formed between the second semiconductor chip and the first recess portion, wherein the recess portion is formed in the solder resist layer at a position corresponding to the at least one end portion of the second semiconductor chip.

The insulation member may include underfill resin that contacts a side surface of the first semiconductor chip. The insulation member may be a molding member that encapsulates the first semiconductor chip and the second semiconductor chip.

The insulation member may be formed between the at least one end portion of the second semiconductor chip and the exposed portion of the base substrate.

An upper surface of the first semiconductor chip may include a first area that is covered by the second semiconductor chip and a second area that is not covered by the second semiconductor chip, and the first recess portion may be formed in the solder resist layer at a position corresponding to a peripheral end portion of the first area of the first semiconductor chip.

The semiconductor package may further include a second recess that is formed in the solder resist layer at a position corresponding to a peripheral end portion of the second area. The first recess portion and the second recess portion may be connected to each other. The insulation member may include underfill resin that fills the first recess portion and the second recess portion.

The underfill resin may be not formed on the first semiconductor chip at a position corresponding to a boundary between the first area and the second area.

In example embodiments, the first semiconductor chip and the second semiconductor chip may be the same.

In accordance with example embodiments, a printed circuit board may include a base substrate on which a first semiconductor chip and a second semiconductor stacked on the first semiconductor chip are mounted, a solder resist layer formed between the base substrate and the first semiconductor chip, and a first recess portion formed in the solder resist layer, wherein the second semiconductor chip comprises at least one end portion protruding from the first semiconductor chip, and the first recess portion is formed in the solder resist layer at a position corresponding to the at least one end portion of the second semiconductor chip.

An upper surface of the first semiconductor chip may include a first area that is covered by the second semiconductor chip and a second area that is not covered by the second semiconductor chip, and the first recess portion may be formed in the solder resist layer at a position corresponding to a peripheral end portion of the first area of the first semiconductor chip.

The printed circuit board may further include a second recess that is formed in the solder resist layer at a position corresponding to a peripheral end portion of the second area.

BRIEF DESCRIPTION OF THE DRAWINGS

Example embodiments will be more clearly understood from the following detailed description taken in conjunction with the accompanying drawings in which.

DETAILED DESCRIPTION OF THE EMBODIMENTS

Figure 1:
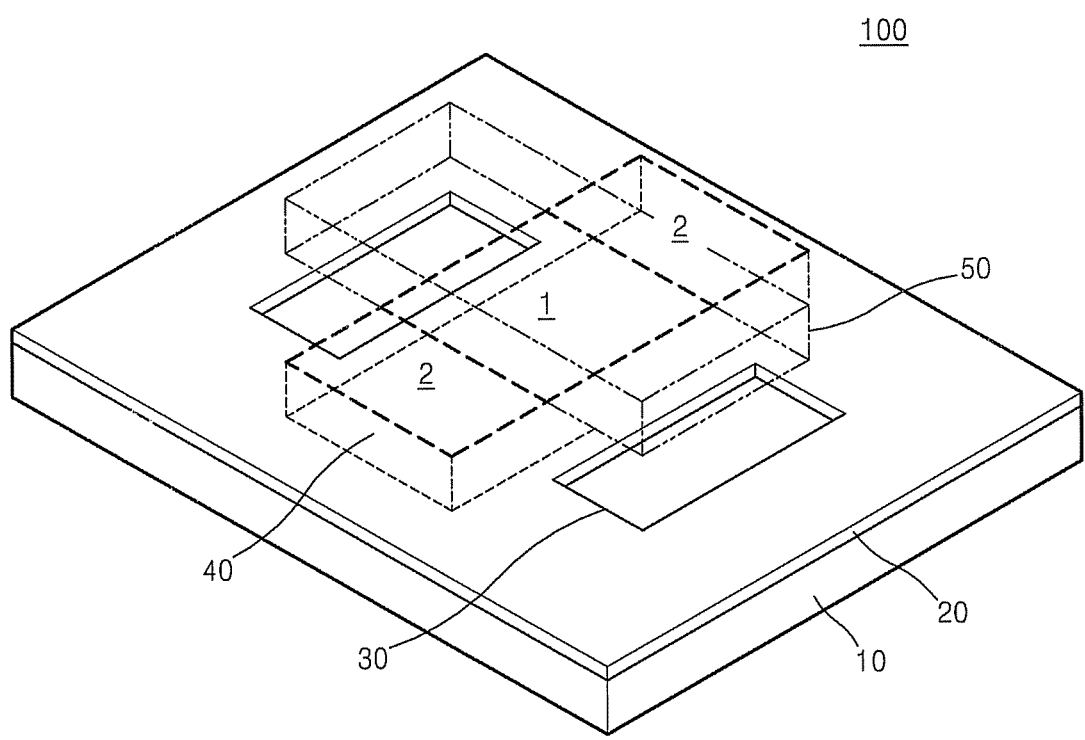
FIG. 1 is a perspective view schematically illustrating a printed circuit board (PCB) according to example embodiments.

Example embodiments are provided to further completely explain the inventive concepts to one skilled in the art to which the inventive concepts pertain. However, the inventive concepts are not limited thereto and it will be understood that various changes in form and details may be made therein without departing from the spirit and scope of the following claims. That is, descriptions on particular structures or functions may be presented merely for explaining example embodiments of the present inventive concepts.

In the following description, when a layer is described to exist on another layer, the layer may exist directly on the other layer or a third layer may be interposed therebetween. Also, the thickness or size of each layer illustrated in the drawings is exaggerated for convenience of explanation and clarity. Like references indicate like constituent elements in the drawings. As used in the present specification, the term "and/or" includes any one of listed items and all of at least one combination of the items.

The terms used in the present specification are used for explaining example embodiments, not for limiting the inventive concepts. Thus, the expression of singularity in the present specification includes the expression of plurality unless clearly specified otherwise in context. Also, the terms such as "comprise" and/or "comprising" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

In the present specification, the terms such as "first" and "second" are used herein merely to describe a variety of members, parts, areas, layers, and/or portions, but the constituent elements are not limited by the terms. It is obvious that the members, parts, areas, layers, and/or portions are not limited by the terms. The terms are used only for the purpose of distinguishing one constituent element from another constituent element. Thus, without departing from the right scope of the inventive concepts, a first member, part, area, layer, or portion may refer to a second member, part, area, layer, or portion.

Hereinafter, example embodiments of the inventive concepts are described in detail with reference to the accompanying drawings. In the drawings, the illustrated shapes may be modified according to, for example, manufacturing technology and/or tolerance. Thus, the example embodiments may not be construed to be limited to a particular shape of a part described in the present specification and may include a change in the shape generated during manufacturing, for example.

FIG. 1 is a perspective view schematically illustrating a printed circuit board (PCB) 100 according to example embodiments. Referring to FIG. 1, the PCB 100 may include a base substrate 10, a solder resist layer 20, and a recess portion 30.

The base substrate 10 may include an epoxy resin, a polyimide resin, a bismalemide triazine (BT) resin, a flame retardant 4 (FR-4), FR-5, a ceramic, silicon, or glass. This list is exemplary and the present inventive concepts are not limited thereto. The base substrate 10 may be a single layer structure including wiring patterns or a multilayer structure including wiring patterns.

For example, the base substrate 10 may be formed of a single rigid substrate, a plurality of rigid substrates by being adhered to one another, or a thin flexible PCB and a rigid flat panel adhered to each other. Each of the rigid substrates adhered to one another may include a wiring pattern and a connection pad. Also, the base substrate 10 may be a low temperature co-fired ceramic (LTCC) substrate. The LTCC substrate may be formed of a plurality of stacked ceramic layers and include a wiring pattern.

The solder resist layer 20 may be formed by coating solder resist ink on the base substrate 10. A method of coating the solder resist ink may include screen coating, roll coating, and curtain coating.

The solder resist ink may include solvent, a photopolymerization initiator, acrylate based resin, epoxy based resin, and a filler. The photopolymerization initiator may induce polymerization of acrylate based resin after being radicalized by an ultraviolet ray. The epoxy based resin may be cured by heat. Also, the filler may decrease a coefficient of thermal expansion (CTE) of the solder resist ink.

The recess portion 30 may be formed in the solder resist layer 20. Also, the recess portion 30 may expose a portion of the base substrate 10. In detail, a first semiconductor chip 40 may be mounted on the base substrate 10 and a second semiconductor chip 50 may be stacked on the first semiconductor chip 40. In example embodiments, the second semiconductor chip 50 may include at least one end portion protruding from the first semiconductor chip 40. The recess portion 30 may be formed in the solder resist layer 20 at a position corresponding to the at least one protruding end portion of the second semiconductor chip 50.

In other words, an upper surface of the first semiconductor chip 40 may include a first area 1 that is covered by the second semiconductor chip 50 and a second area 2 that is not covered by the second semiconductor chip 50. In example embodiments, the recess portion 30 may be formed in the solder resist layer 20 at a position corresponding to a peripheral end portion of the first area 1.

Figure 2:
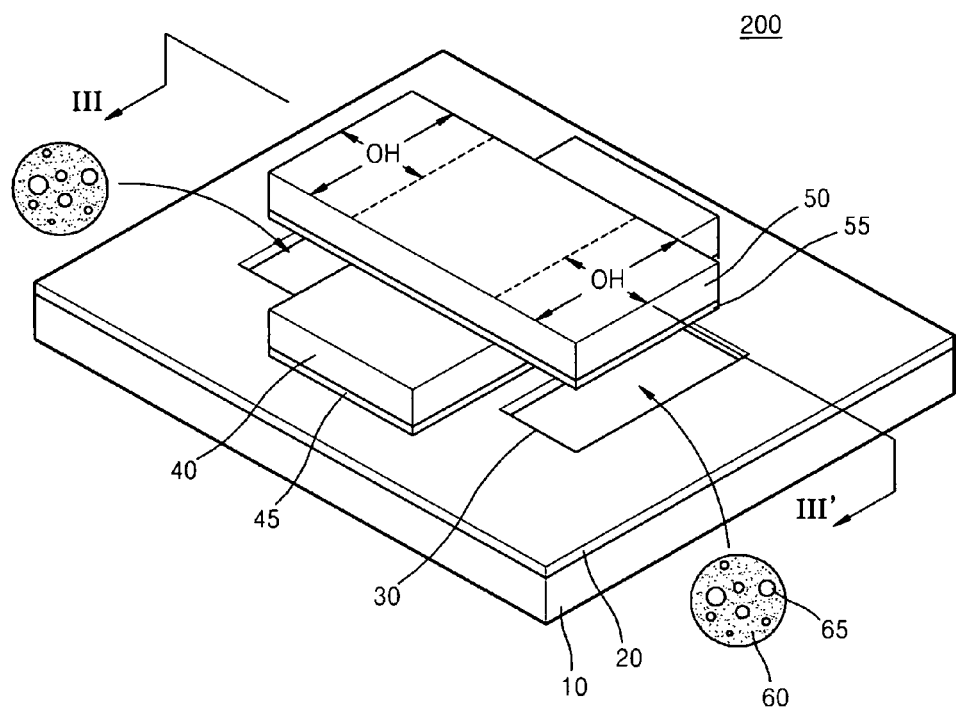
FIG. 2 is a perspective view schematically illustrating a semiconductor package according to example embodiments.
Figure 3:
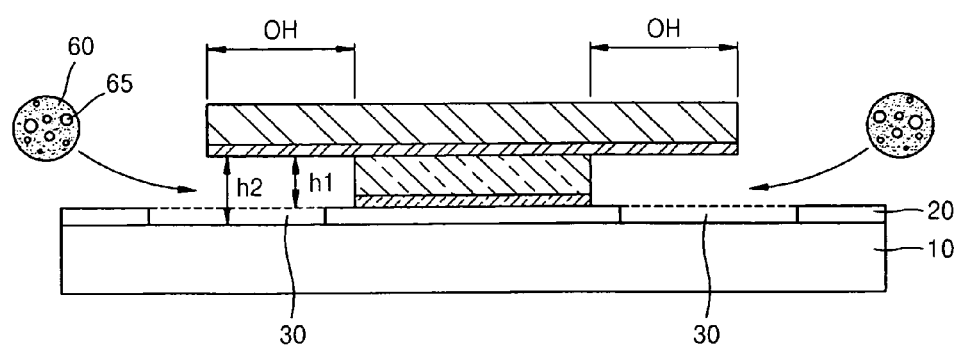
FIG. 3 is a cross-sectional view taken along a line of FIG. 2.

FIG. 2 is a perspective view schematically illustrating a semiconductor package 200 according to example embodiments. FIG. 3 is a cross-sectional view taken along a line III-III' of FIG. 2. The semiconductor package 200 may include the PCB 100 of FIG. 1. A redundant description will be omitted herein.

Referring to FIGS. 2 and 3, the semiconductor package 200 may include the base substrate 10, the solder resist layer 20, the recess portion 30, the first semiconductor chip 40, the second semiconductor chip 50, and an insulation member 60. The first semiconductor chip 40 may be mounted on the solder resist layer 20. In detail, the first semiconductor chip 40 may be mounted on the solder resist layer 20 by using a first adhesive tape 45. The first adhesive tape 45 may be a well-known high temperature tape, for example, a glass tape, a silicon tape, a Teflon tape, a stainless foil tape, or a ceramic tape. Also, the first adhesive tape 45 may be a tape including aluminum oxide, aluminum nitride, silicon oxide, or beryllium oxide.

Although not illustrated in the drawings, the first semiconductor chip 40 may be electrically connected to the base substrate 10 by flip chip bonding. In example embodiments, an underfill resin (not shown), not the first adhesive tape 45, may be provided between the first semiconductor chip 40 and the base substrate 10.

The second semiconductor chip 50 may be stacked on the first semiconductor chip 40 using a second adhesive tape 55. In example embodiments, the second semiconductor chip 50 may include at least one end portion protruding from the first semiconductor chip 40. An area corresponding to where the at least one protruding end portion of the second semiconductor chip 50 is formed is defined to be an overhang area OH.

As described above, the recess portion 30 may be formed in the solder resist layer 20 at the area corresponding to the at least one protruding end portion of the second semiconductor chip 50, that is, the overhang area OH. In other words, as described in FIG. 1, the recess portion 30 may be formed in the solder resist layer 20 at a position corresponding to the peripheral end portion of the first area 1.

The insulation member 60 may be injected into a gap between the second semiconductor chip 50 and the recess portion 30 by using a capillary phenomenon. In detail, the insulation member 60 may be injected into a gap between the second semiconductor chip 50 and the portion of the base substrate 10 that is exposed by the recess portion 30. In example embodiments, the insulation member 60 may be an underfill resin. The underfill resin may include a filler 65, for example, an epoxy based resin and silicon particles.

When the recess portion 30 is not formed, if a gap h1 between the second semiconductor chip 50 and the solder resist layer 20 is less than diameters of particles of the filler 65 included in the underfill resin, the underfill resin including the filler 65 may not be injected into the gap h1 and thus a defect such as an underfill void may be generated. In example embodiments, however, a gap h2 between the second semiconductor chip 50 and the base substrate 10 is greater than the gap h1 by an amount corresponding to the thickness of the solder resist layer 20. Thus, the filler 65 of the insulation member 60 may be more easily injected into the gap h2. That is, a gap-fill margin is increased so that reliability of a semiconductor device may be improved.

Figure 4:
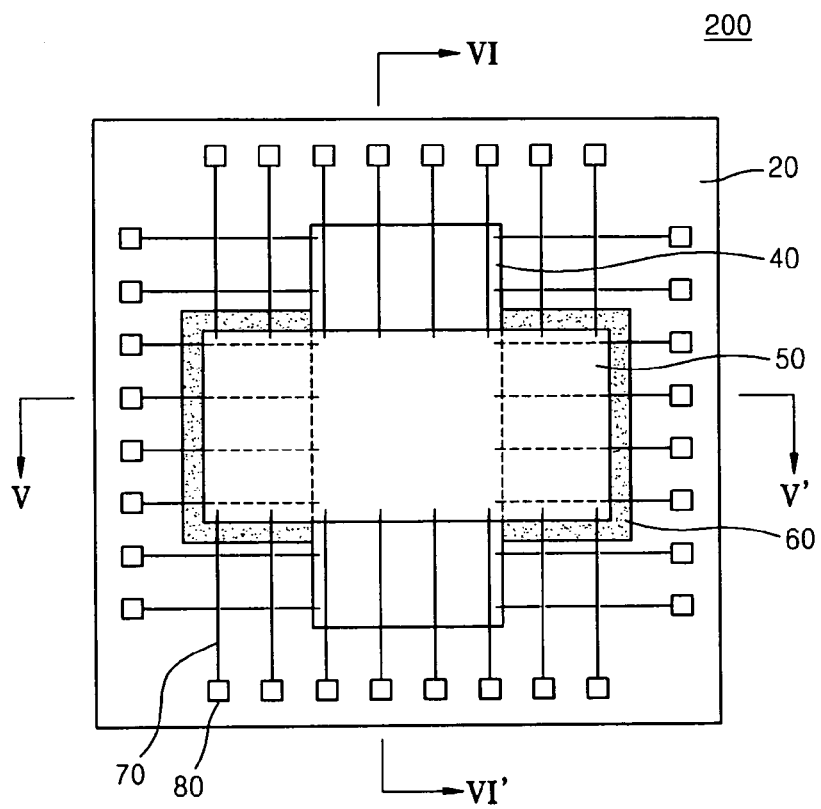
FIG. 4 is a plan view schematically illustrating a semiconductor package according to example embodiments.
Figure 5:
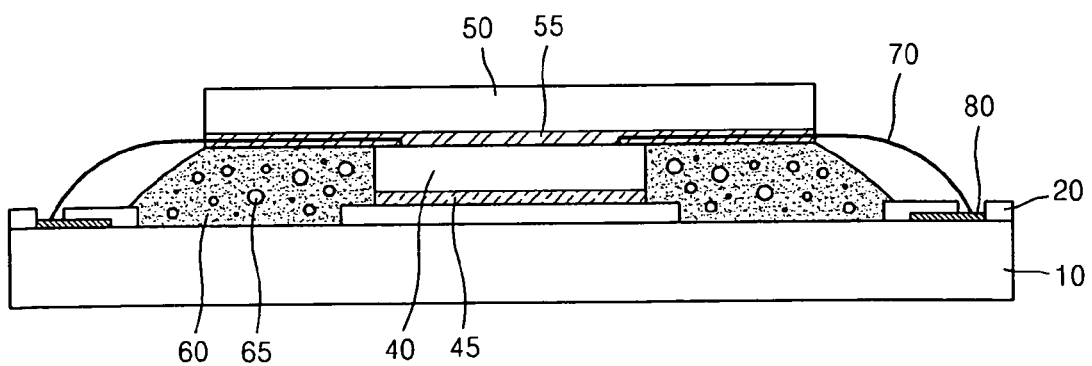
FIG. 5 is a cross-sectional view taken along a line V-V' of FIG. 4.
Figure 6:
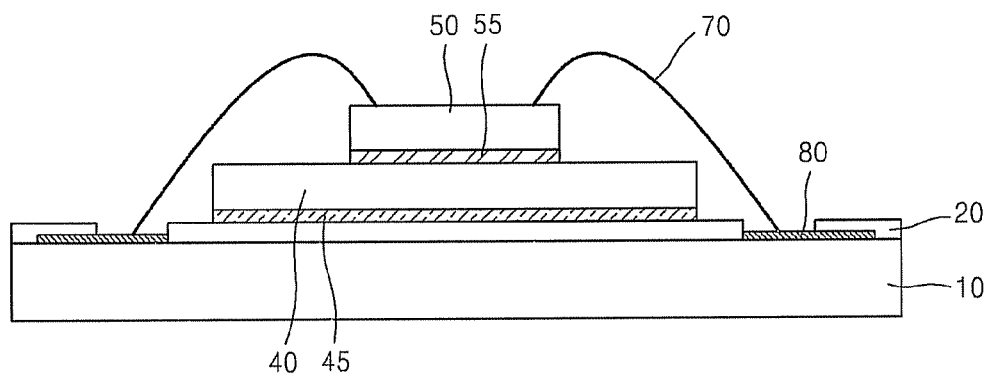
FIG. 6 is a cross-sectional view taken along a line VI-VI' of FIG. 4.

FIG. 4 is a plan view schematically illustrating a semiconductor package 200 according to example embodiments. FIG. 5 is a cross-sectional view taken along a line V-V' of FIG. 4. FIG. 6 is a cross-sectional view taken along a line VI-VI' of FIG. 4. The semiconductor package 200 according to example embodiments may be a modified example of the semiconductor package 200 of FIGS. 2 and 3. In this regard, a redundant description will be omitted herein.

Referring to FIG. 4, the insulation member 60 is formed between the second semiconductor chip 50 and the recess portion 30. The insulation member 60 may be formed between the second semiconductor chip 50 and the portion of the base substrate 10 exposed by the recess portion 30. The thickness of the insulation member 60 may be identical to the sum of the thicknesses of the first semiconductor chip 40, the first adhesive tape 45, and the solder resist layer 20.

The solder resist layer 20 may be formed in such a way that it does not completely cover a bonding pad 80 to be electrically connected to an outside element. The bonding pad 80 may be a portion that is wire bonded to the first and second semiconductor chips 40 and 50. Thus, the first and second semiconductor chips 40 and 50 may be electrically connected to a circuit pattern (not shown) in the base substrate 10 via a wire 70 and the bonding pad 80.

The first semiconductor chip 40 and the second semiconductor chip 50 may be similar or identical. That is, the first and second semiconductor chips 40 and 50 may have the same layout and chip pad arrangement. Also, to optimize the wiring pattern of the PCB 100, the second semiconductor chip 50 may be stacked to be vertically symmetrical to the first semiconductor chip 40. Although the first semiconductor chip 40 and the second semiconductor chip 50 may be similar or identical, example embodiments are not limited thereto as the first semiconductor chip 40 and the second semiconductor chip 50 may be dissimilar and may have a different layout and chip pad arrangement. Furthermore, the second semiconductor chip 50 does not have to be stacked on the first semiconductor chip 40 in a manner that would render it vertically symmetrical to the first semiconductor chip 40.

Although in the drawings the first semiconductor chip 40 is mounted directly on the PCB 100 and the second semiconductor chip 50 is stacked on the first semiconductor chip 40, example embodiments are not limited thereto. For example, a chip scale package (CSP), instead of a semiconductor chip, may be mounted on the PCB 100 and the technical concepts illustrated in example embodiments may be applied thereto.

Figure 7:
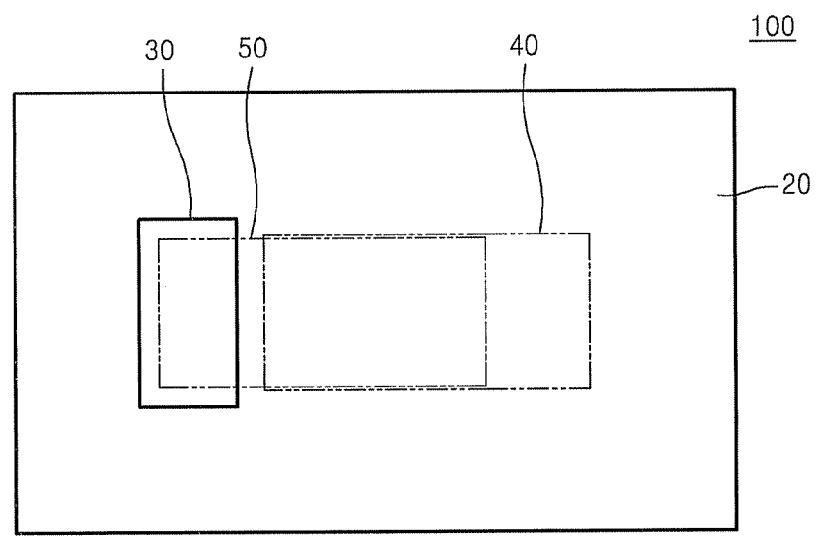
FIG. 7 is a plan view schematically illustrating a PCB according to example embodiments.
Figure 8:
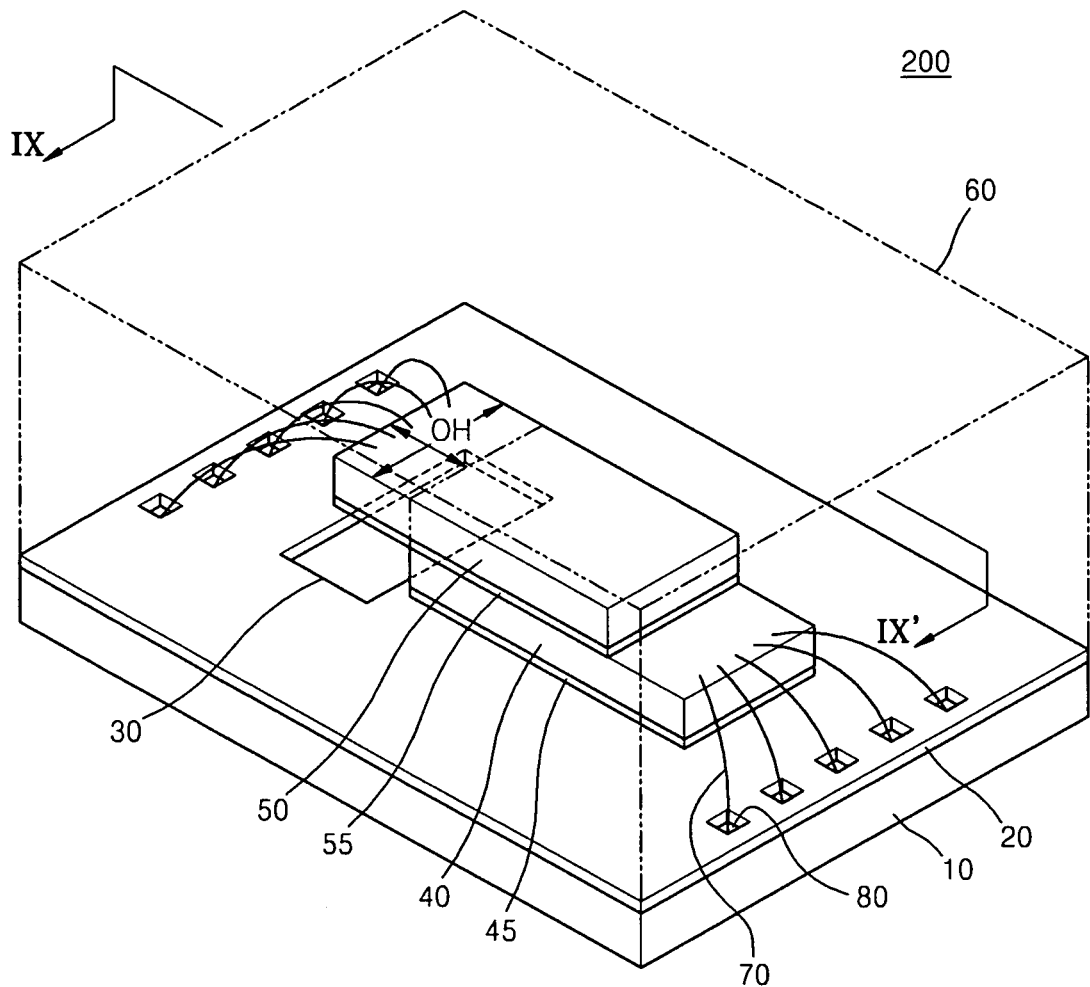
FIG. 8 is a perspective view schematically illustrating a semiconductor package according to example embodiments.
Figure 9:
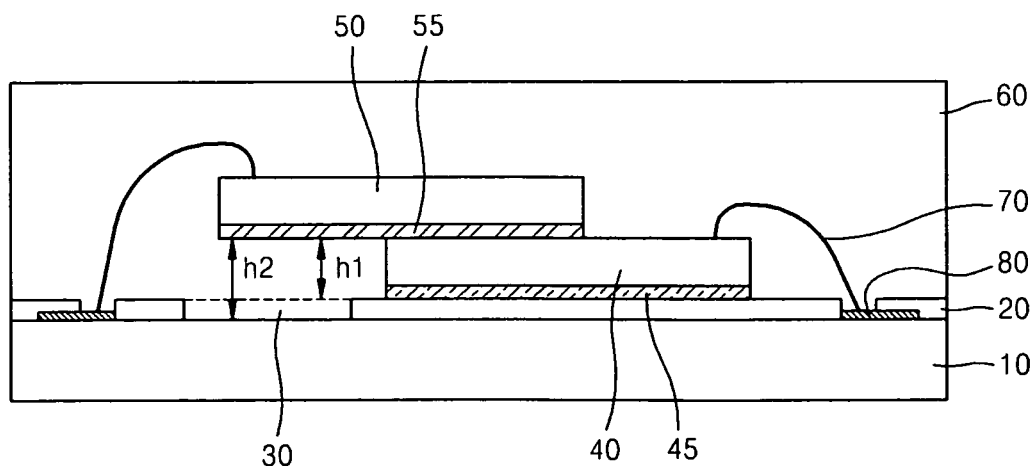
FIG. 9 is a cross-sectional view taken along a line IX-IX' of FIG. 8.

FIG. 7 is a plan view schematically illustrating a PCB 100 according to example embodiments. FIG. 8 is a perspective view schematically illustrating a semiconductor package 200 according to example embodiments. FIG. 9 is a cross-sectional view taken along a line IX-IX' of FIG. 8. The PCB 100 and the semiconductor package 200 according to example embodiments may be modified examples of the PCB 100 and the semiconductor package 200 of FIGS. 1-6. In this regard, a redundant description will be omitted herein.

Referring to FIGS. 7-9, the first and second semiconductor chips 40 and 50 may be stacked in an offset manner. In example embodiments, the insulation member 60 may be filled between the base substrate 10 and an end portion of the second semiconductor chip 50 stacked in the offset manner. In detail, the insulation member 60 may be filled between the base substrate 10 and the overhang area OH, that is, the end portion of the second semiconductor chip 50 protruding from the first semiconductor chip 40. To increase a gap-fill margin, the recess portion 30 may be formed in a portion of the solder resist layer 20 corresponding to the overhang area OH.

The insulation member 60 may be a molding member that encapsulates both of the first and second semiconductor chips 40 and 50. That is, the insulation member 60 is not limited to underfill resin. By increasing the gap-fill margin under the second semiconductor chip 50 by forming the recess portion 30, a gap between the second semiconductor chip 50 and the base substrate 10 may be filled with a molding member, without using underfill resin.

Figure 10:
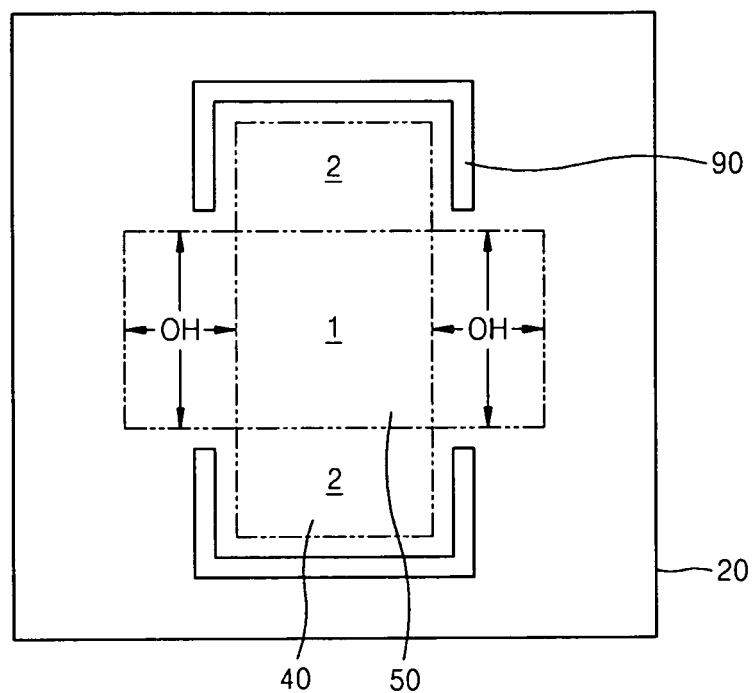
FIGS. 10 and 11 are plan views schematically illustrating PCBs according to example embodiments.
Figure 11:
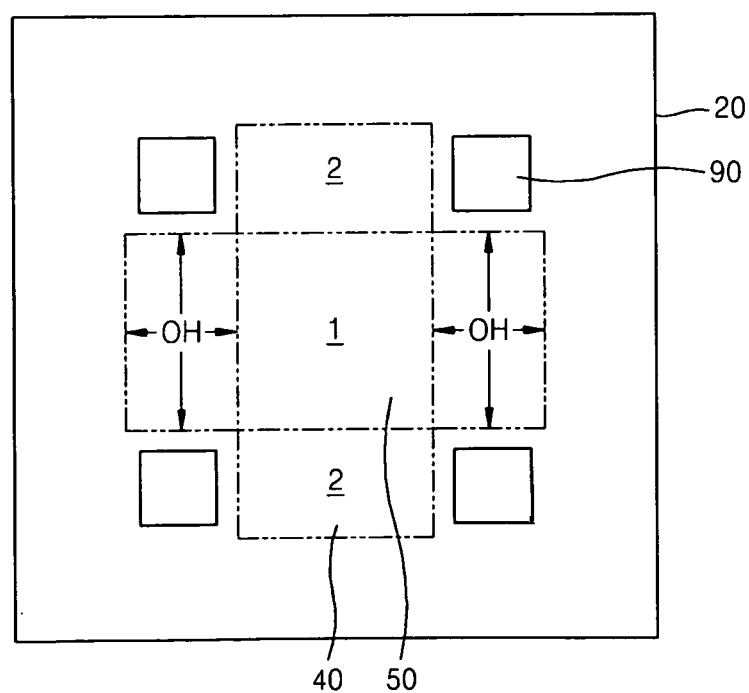

FIGS. 10 and 11 are plan views schematically illustrating the PCBs 100 according to example embodiments. The semiconductor package 200 according to example embodiments may be modified examples of the PCB 100 of FIG. 1. In this regard, a redundant description will be omitted herein.

Referring to FIGS. 10 and 11, a recess portion 90 may be formed close to the overhang area OH. In detail, when the upper surface of the first semiconductor chip 40 includes the first area 1, which is covered by the second semiconductor chip 50, and the second area 2, which is not covered by the second semiconductor chip 50, the recess portion 90 may be formed in the solder resist layer 20 at a position corresponding to a peripheral end portion of the first area 1. That is, the recess portion 90 may be foamed in the solder resist layer 20 along the peripheral end portions of the first semiconductor chip 40, in an area other than the area corresponding to the overhang area OH.

As illustrated in FIG. 10, the recess portion 90 may be formed to surround the entire peripheral end portions of the second area 2 of the first semiconductor chip 40. Also, as illustrated in FIG. 11, the recess portion 90 may be formed to surround only a portion of the peripheral end portions of the second area 2 of the first semiconductor chip 40. The width of the recess portion 90 may be thinner than the width of the overhang area OH as illustrated in FIG. 10, or substantially the same as the width of the overhang area OH as illustrated in FIG. 11. However, the recess portion 90 is formed having a pattern capable of providing a path through which underfill resin may flow during an underfill process. Example embodiments are not limited to the shapes of FIGS. 10 and 11.

Figure 12:
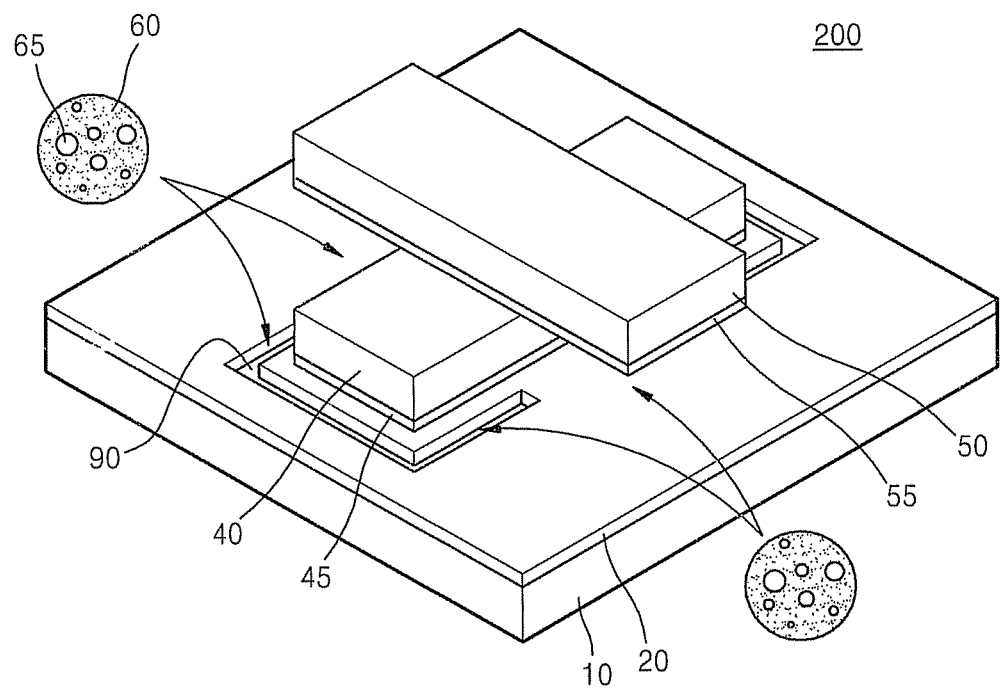
FIGS. 12 and 13 are perspective views schematically illustrating a PCB according to example embodiments.
Figure 13:
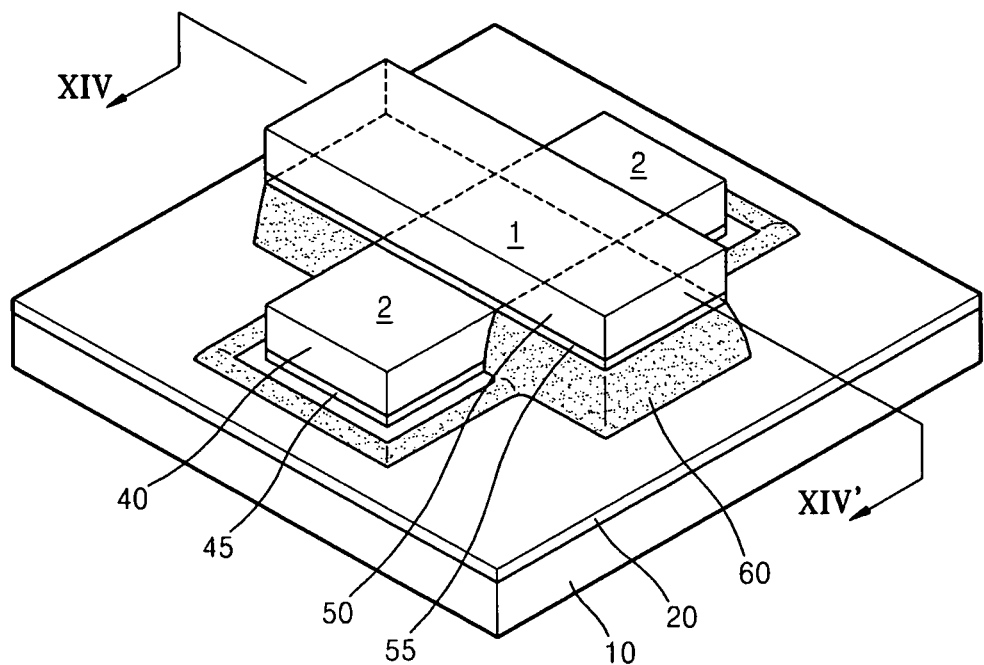
Figure 14:
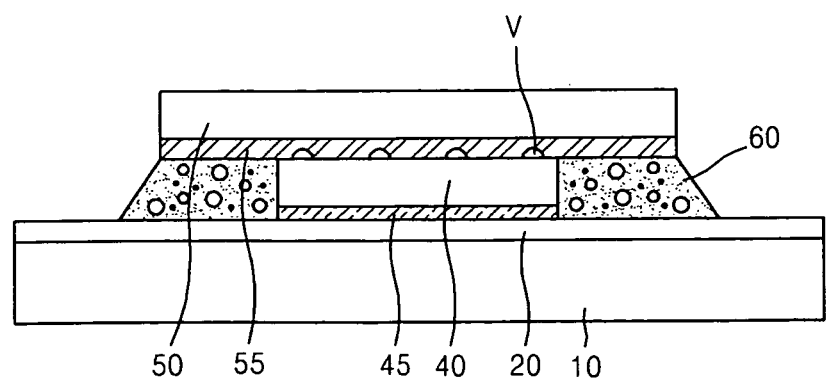
FIG. 14 is a cross-sectional view taken along a line XIV-XIV' of FIG. 13.

FIGS. 12 and 13 are perspective views schematically illustrating a semiconductor package 200 according to example embodiments. FIG. 14 is a cross-sectional view taken along a line XIV-XIV' of FIG. 13. The semiconductor package 200 of example embodiments may include the PCB 100 of FIG. 10. In this regard, a redundant description will be omitted herein.

Referring to FIG. 12, to perform an underfill process, at least one drop of the insulation member 60, which may be underfill resin, is disposed close to the overhang area OH of the second semiconductor chip 50. In example embodiments, the underfill resin flows onto the solder resist layer 20 corresponding to the overhang area OH by a capillary phenomenon. Thus, the underfill resin may fill a space between a lower surface of the second semiconductor chip 50 and the solder resist layer 20.

When the recess portion 90 is not formed, the underfill resin may move onto the upper surface of the first semiconductor chip 40 to form fillets on four surfaces of the second semiconductor chip 50. The fillets encapsulate the second adhesive tape 55 and thus a path through which voids V generated in the second adhesive tape 55 may escape may be sealed. The voids V may be removed by a subsequent heating process of the semiconductor package 200. However, when the fillets are formed on four surfaces of the second semiconductor chip 50, a void trap phenomenon in which the voids V remain in spite of the subsequent heating process may be generated. The void trap phenomenon causes deterioration of reliability such as delamination of the second semiconductor chip 50.

In example embodiments, because the semiconductor package 200 according to example embodiments includes the recess portion 90, which provides a path through which the underfill resin may flow during an underfill process, the formation of the fillets encapsulating the second adhesive tape 55 may be prevented or reduced. In other words, the recess portion 90 may prevent or reduce the voids V formed in the second adhesive tape 55 from being trapped by the underfill resin.

Referring to FIGS. 13 and 14, underfill resin may be injected into the recess portion 90 and onto the solder resist layer 20 corresponding to the overhang area OH. In detail, the underfill resin may be injected into the recess portion 90 corresponding to the peripheral end portion of the second area 2, which is an area other than the first area 1 of the first semiconductor chip 40, and the solder resist layer 20 corresponding to the peripheral end portion of the first area 1, which overlaps the second semiconductor chip 50.

The underfill resin filling the first area 1 may fill the recess portion 90. However, the underfill resin does not move onto the upper surface of the first semiconductor chip 40 and thus no fillet is formed. That is, the underfill resin 60 is formed along the recess portion 90, not on the first semiconductor chip 40 at a position corresponding to a boundary between the first area 1 and the second area 2. Thus, since the fillets that encapsulate the voids V formed in the second adhesive tape 55 are not formed, the voids V may be removed, partially or completely, in the subsequent heating process of the semiconductor package 200. Thus, the delamination problem of the second semiconductor chip 50 may be prevented or reduced and reliability of the semiconductor package 200 may be improved.

Figure 15:
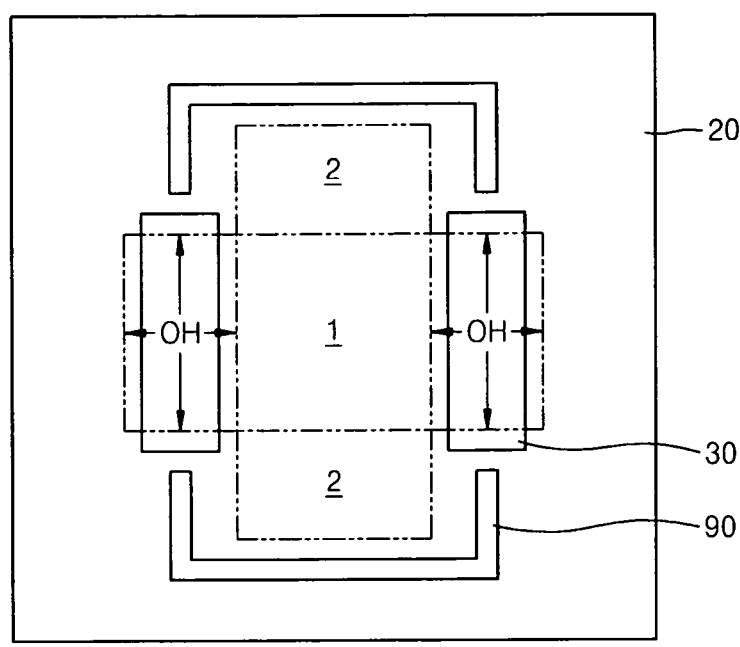
FIGS. 15-17 are plan views schematically illustrating PCBs according to example embodiments.
Figure 16:
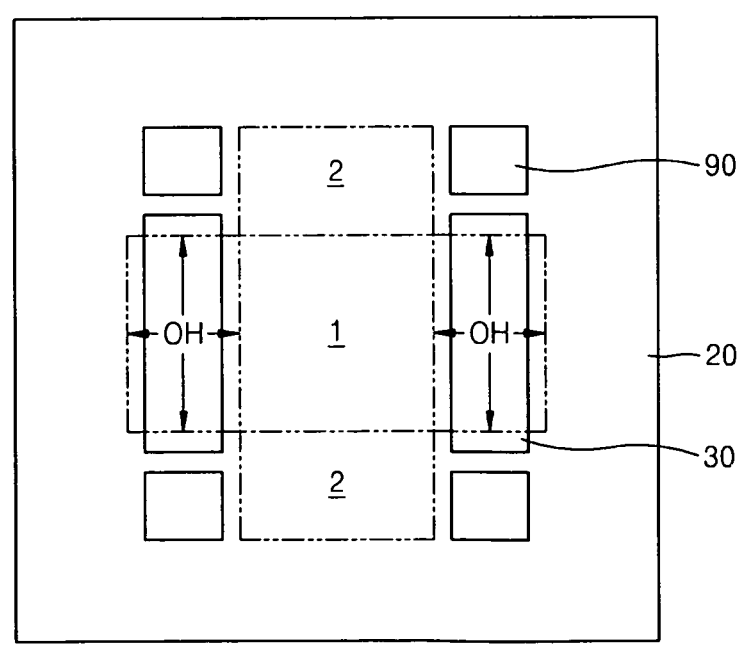
Figure 17:
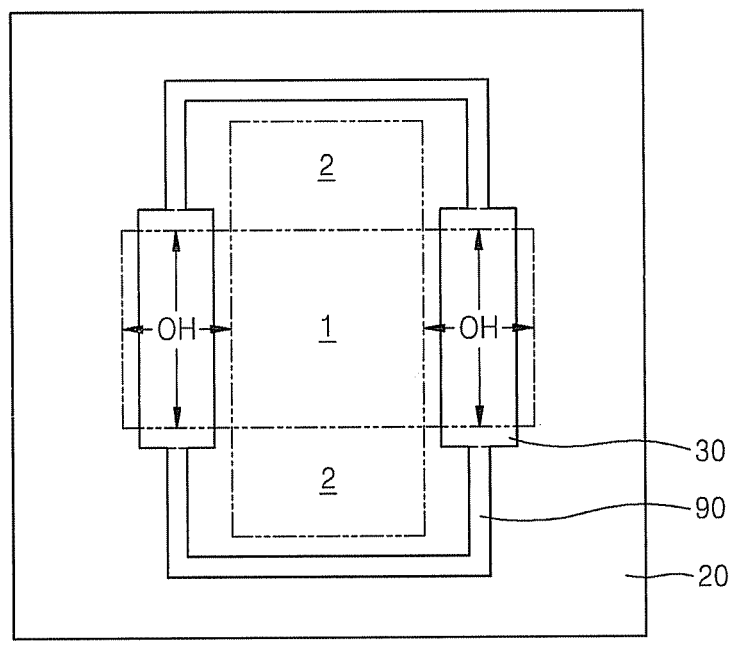

FIGS. 15-17 are plan views schematically illustrating the PCBs 100 according to example embodiments. The printed circuit boards 100 in FIGS. 15-17 according to example embodiments may be modified examples of the printed circuit board 100 of FIG. 1 and the printed circuit boards 100 of FIGS. 10 and 11. In this regard, a redundant description will be omitted herein.

Referring to FIGS. 15 and 16, the recess portion 30, (here a first recess portion) may be formed in the solder resist layer 20 at a position corresponding to the overhang area OH. That is, the first recess portion 30 may be in the solder resist layer 20 at a position corresponding to the peripheral end portion of the first area 1 that is covered by the second semiconductor chip 50. In addition, the second recess portion 90 may be formed in the solder resist layer 20 at a position corresponding to the peripheral end portion of the second area 2 that is not covered by the second semiconductor chip 50.

The first recess portion 30 and the recess portion 90, (here a second recess portion) may be separated from each other. In detail, considering the amount of flow of the underfill resin, the separation distance between the first and second recess portions 30 and 90 may be adjusted to form a movement path of the underfill resin toward the second recess portion 90. Also, the first recess portion 30 and the second recess portion 90 may be connected to each other as illustrated in FIG. 17.

Figure 18:
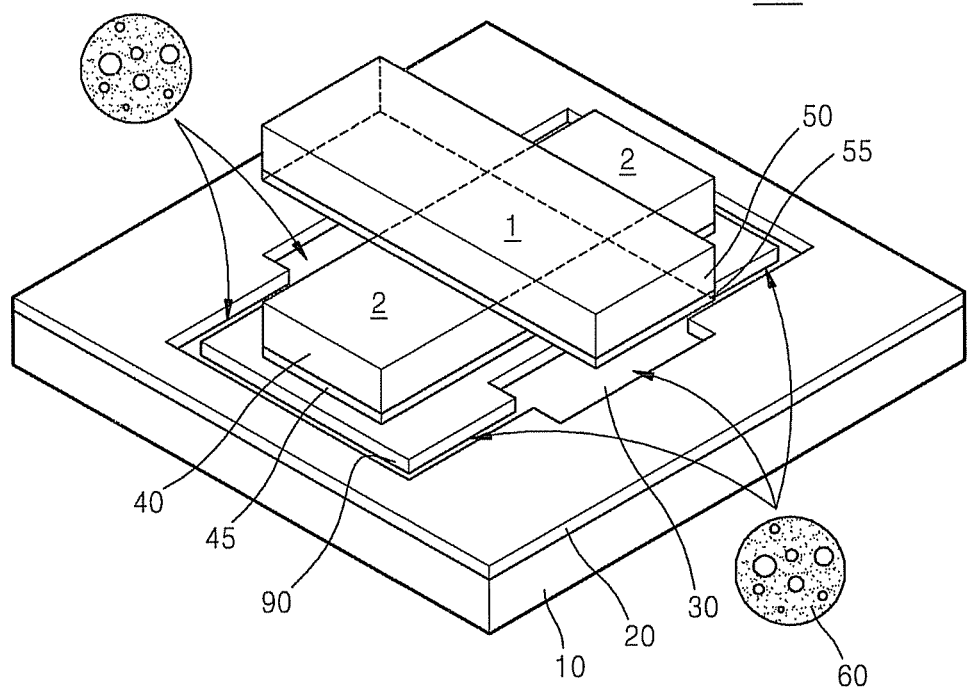
FIGS. 18 and 19 are perspective views schematically illustrating a semiconductor package according to example embodiments.
Figure 19:
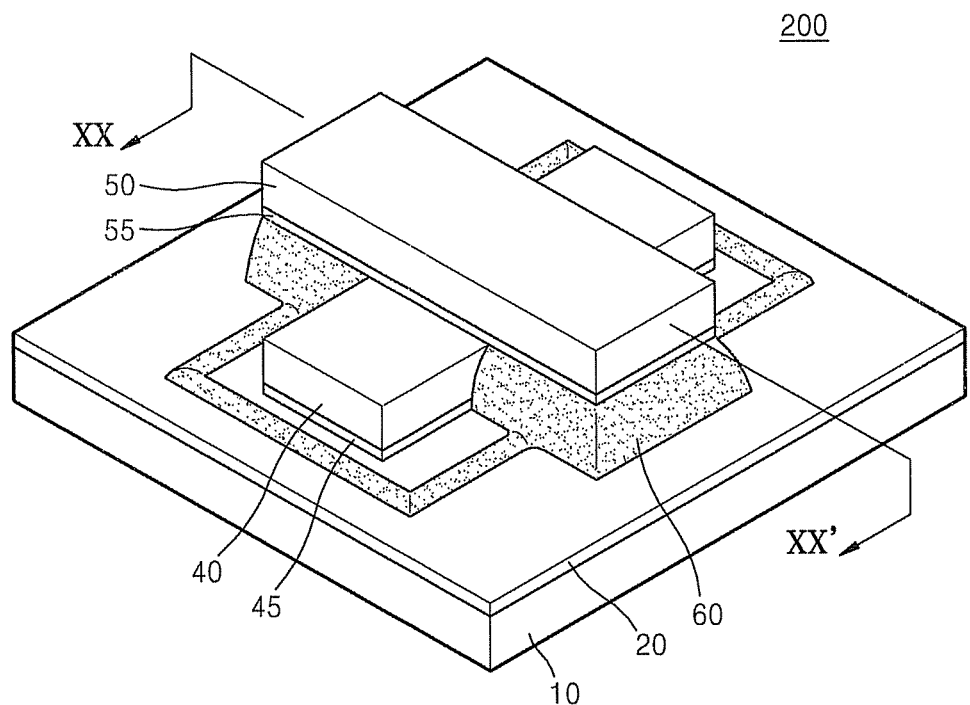
Figure 20:
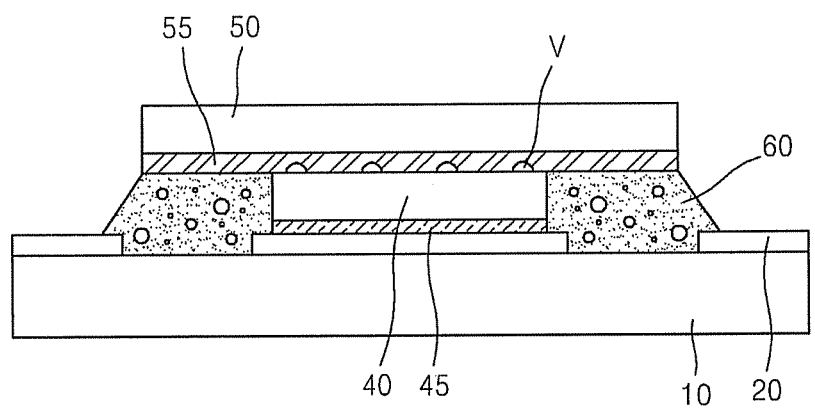
FIG. 20 is a cross-sectional view taken along a line XX-XX' of FIG. 19.

FIGS. 18 and 19 are perspective views schematically illustrating the semiconductor package 200 according to example embodiments. FIG. 20 is a cross-sectional view taken along a line XX-XX' of FIG. 19. The semiconductor package 200 according to example embodiments may include the PCB 100 of FIG. 15 or 17. In this regard, a redundant description will be omitted herein.

As described above, the gap-fill margin of the underfill resin may be increased by the first recess portion 30. Also, since the second recess portion 90 provides an additional movement path of the underfill resin, the underfill resin may not be formed on the first semiconductor chip 40 at a position corresponding to the boundary between the first area 1 and the second area 2.

Figure 21:
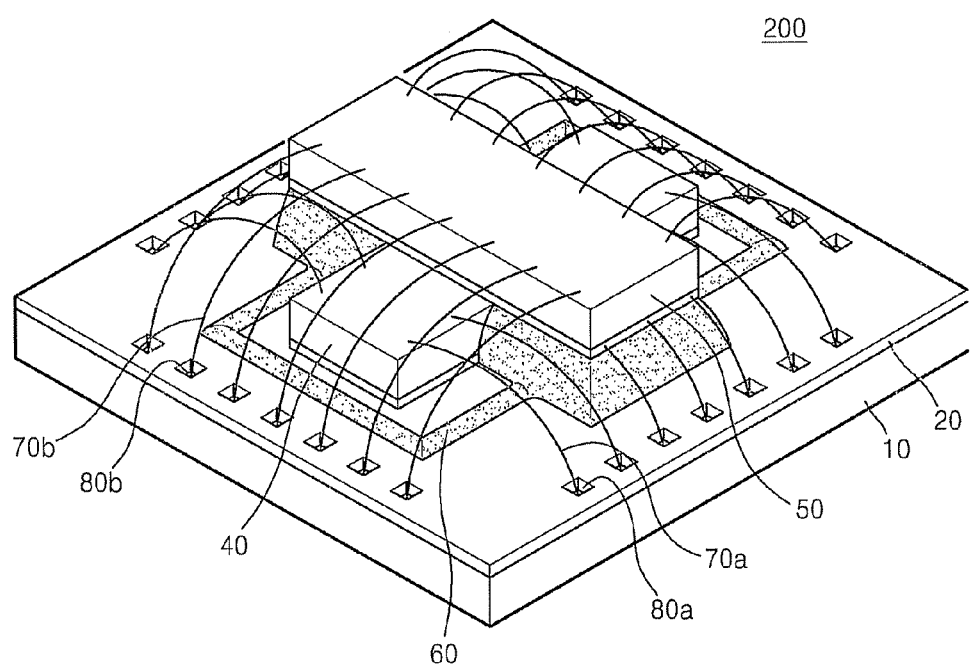
FIG. 21 is a perspective view schematically illustrating a semiconductor package according to example embodiments.

FIG. 21 is a perspective view schematically illustrating the semiconductor package 200 according to example embodiments. Referring to FIG. 21, the first semiconductor chip 40 and the second semiconductor chip 50 may be the same semiconductor chip and may be stacked to be vertically symmetrical to each other. However, example embodiments are not limited thereto as the first and second semiconductor chips 40 and 50 may not be the same semiconductor chip. In example embodiments, a plurality of first bonding pads 80a for electrical connection with the first semiconductor chip 40 may be formed to be vertically symmetrical to a plurality of second bonding pads 80b for electrical connection with the second semiconductor chip 50. In example embodiments, a plurality of first wires 70a may electrically connect the first semiconductor chip 40 and the first bonding pads 80a, and a plurality of second wires 70b may electrically connect the second semiconductor chip 50 and the second bonding pads 80b.

As described above, in the PCB and semiconductor package according to example embodiments, since a gap-fill material may be filled between a recess portion of the PCB and a semiconductor chip, a gap-fill margin may be improved. Also, the PCB and semiconductor package according to example embodiments may include a recess portion that provides a path through which underfill resin may flow during an underfill resin process, the formation of a fillet that encapsulates an adhesive tape may be prevented or reduced. Thus, voids of an adhesive tape may be prevented from being trapped by the underfill resin or the number of voids in an adhesive tape may be reduced due to the reducing formation of fillets formed by the underfill resin.

While example embodiments of the inventive concepts have been particularly shown and described with reference to the figures, it will be understood that various changes in form and details may be made therein without departing from the spirit and scope of the following claims.

What is claimed is:

1. A semiconductor package comprising:
   a base substrate;
   a solder resist layer on the base substrate, the solder resist layer including a first recess portion;
   a first semiconductor chip on the base substrate; and
   a second semiconductor chip on the first semiconductor chip, the second semiconductor chip comprising at least one end portion protruding from the first semiconductor chip and overhanging the first recess portion.

2. The semiconductor package of claim 1, further comprising:
   an insulation member between the second semiconductor chip and the first recess portion.

3. The semiconductor package of claim 2, wherein
   the first recess portion exposes a portion of the base substrate, and
   the insulation member is between the second semiconductor chip and the exposed portion of the base substrate.

4. The semiconductor package of claim 3, further comprising:
   an adhesive tape between the first semiconductor chip and the solder resist layer.

5. The semiconductor package of claim 4, wherein a thickness of the insulation member is the same as a sum of thicknesses of the first semiconductor chip, the adhesive tape, and the solder resist layer.

6. The semiconductor package of claim 2, wherein the insulation member contacts a side surface of the first semiconductor chip.

7. The semiconductor package of claim 2, wherein the insulation member encapsulates the first semiconductor chip and the second semiconductor chip.

8. The semiconductor package of claim 1, further comprising:
   an insulation member between the second semiconductor chip and the first recess portion, wherein the first recess portion exposes a portion of the base substrate and the insulation member extends from the exposed portion of the base substrate to at least a bottom of the at least one end portion.

9. The semiconductor package of claim 8, wherein the insulation member includes an underfill resin contacting a side surface of the first semiconductor chip.

10. The semiconductor package of claim 8, wherein the insulation member is a molding member encapsulating the first semiconductor chip and the second semiconductor chip.

11. The semiconductor package of claim 8, further comprising:
    an adhesive tape between the first semiconductor chip and the second semiconductor chip.

12. The semiconductor package of claim 8, wherein an upper surface of the first semiconductor chip includes a first area covered by the second semiconductor chip and a second area not covered by the second semiconductor chip, and the first recess portion is in the solder resist layer at a position corresponding to a peripheral end portion of the first area of the first semiconductor chip.

13. The semiconductor package of claim 12, wherein the solder resist layer further includes a second recess portion at a position corresponding to a peripheral end portion of the second area.

14. The semiconductor package of claim 13, wherein the first recess portion and the second recess portion are connected to each other.

15. The semiconductor package of claim 13, wherein the insulation member includes an underfill resin that fills the first recess portion and the second recess portion.

16. The semiconductor package of claim 15, wherein the underfill resin is not on the first semiconductor chip at a position corresponding to a boundary between the first area and the second area.

17. The semiconductor package of claim 8, wherein the first semiconductor chip and the second semiconductor chip are the same.

18. The semiconductor package of claim 1, wherein the at least one end portion above the first recess region is configured to overhang the first recess region.

19. The semiconductor package of claim 1, further comprising:
   an insulation member interposed between the second semiconductor chip and the first recess portion.

20. The semiconductor package of claim 2, wherein the insulation member and the solder resist layer is in direct contact with each other, and the insulation member is configured to fill in the first recess region.

* * * * *